United States Patent
Ji et al.

(10) Patent No.: US 8,144,459 B2
(45) Date of Patent: Mar. 27, 2012

(54) HEAT DISSIPATING SYSTEM WITH FAN MODULE

(75) Inventors: Jin-Biao Ji, Shenzhen (CN); Zhi-Guo Zhang, Shenzhen (CN); Li-Fu Xu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 190 days.

(21) Appl. No.: 12/650,429

(22) Filed: Dec. 30, 2009

(65) Prior Publication Data

US 2011/0090636 A1 Apr. 21, 2011

(30) Foreign Application Priority Data

Oct. 15, 2009 (CN) .................... 2009 2 0312588 U

(51) Int. Cl.
*H05K 7/20* (2006.01)
*F28F 7/00* (2006.01)
*H01L 23/34* (2006.01)
*H05K 5/00* (2006.01)

(52) U.S. Cl. .............. 361/679.47; 361/679.48; 361/697; 361/709; 361/710; 361/719; 165/80.2; 165/80.3; 257/722; 174/16.1; 174/252; 454/184

(58) Field of Classification Search ............. 361/679.46–679.51, 697, 709–710, 361/719; 165/80.2–80.3, 185; 257/722; 174/16.1, 252; 454/184
See application file for complete search history.

(56) References Cited

U.S. PATENT DOCUMENTS

| | | | | |
|---|---|---|---|---|
| 5,793,608 A | * | 8/1998 | Winick et al. ................. | 361/695 |
| 5,813,243 A | * | 9/1998 | Johnson et al. ............... | 62/259.2 |
| 7,036,027 B2 | * | 4/2006 | Kim et al. ..................... | 713/300 |
| 7,435,665 B2 | * | 10/2008 | Airaksinen et al. ........... | 438/478 |
| 7,742,296 B2 | * | 6/2010 | Lai et al. ..................... | 361/679.5 |
| 2005/0088821 A1 | * | 4/2005 | Lee et al. ...................... | 361/697 |
| 2007/0275650 A1 | * | 11/2007 | Chen ............................. | 454/184 |
| 2007/0285886 A1 | * | 12/2007 | Huang .......................... | 361/687 |
| 2008/0094795 A1 | * | 4/2008 | Neal et al. ..................... | 361/687 |
| 2008/0121369 A1 | * | 5/2008 | Long et al. ................... | 165/80.3 |

* cited by examiner

*Primary Examiner* — Zachary M Pape
(74) *Attorney, Agent, or Firm* — Altis Law Group, Inc.

(57) ABSTRACT

A heat dissipating system includes an enclosure, a first fan module, a second fan module of a computer power source. The enclosure has a front panel, a rear panel parallel to the front panel, a side panel, and a top panel. The rear panel defines an output vent therein. A disk drive module is disposed on the front panel and near the top panel. A motherboard with a CPU is disposed on the side panel. The first fan module is configured to dissipate heat generated by the CPU. The second fan module is placed on the rear panel and is aligned with the output vent of the rear panel. The top panel defines a plurality of airflow holes corresponding to the disk drive module. The plurality of the airflow holes is capable of allowing air to flow to the disk drive module for heat dissipating.

14 Claims, 5 Drawing Sheets

HEAT DISSIPATING SYSTEM WITH FAN MODULE

BACKGROUND

1. Technical Field

The disclosure generally relates to heat dissipating systems, especially to a heat dissipating system used in a computer system.

2. Description of Related Art

In some computers and servers, a fan module is placed on the central processing unit (CPU) to remove heat generated by the CPU and other electronic components, and another fan module is secured to a rear plate or a front plate of a computer or server chassis and aligned with the CPU. However, because the another fan module described above is aligned with the CPU, heat generated by a disk drive module, placed on the front panel of the computer far away from the CPU, may not be dissipated efficiently.

Therefore there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
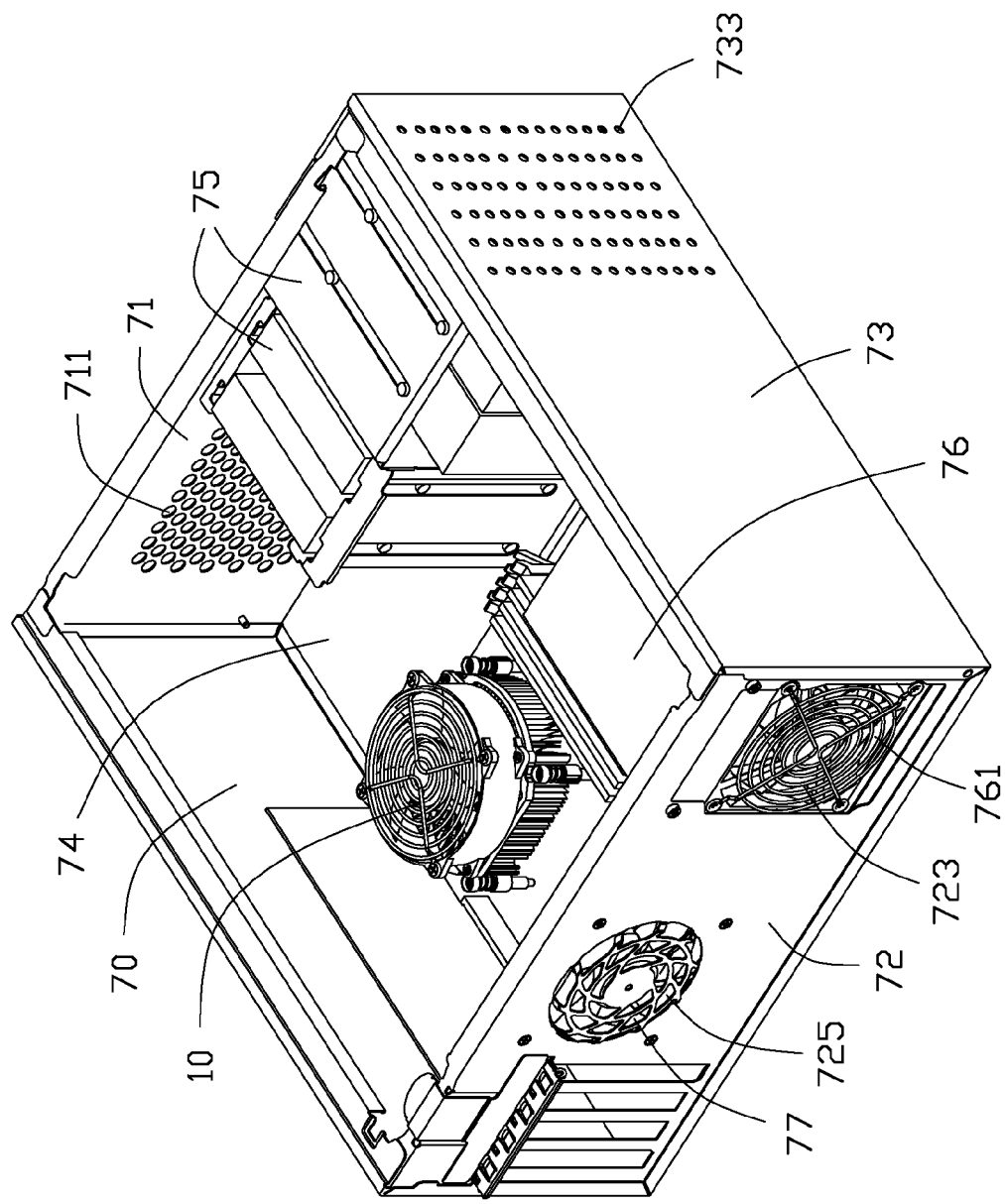
FIG. 1 is an isometric view of a heat dissipating system of an embodiment, the heat dissipating system including a first fan module.

Referring to FIG. 1, a heat dissipating system includes a first fan module 10, an enclosure 70, a second fan module 761 of a computer power source 76, and a third fan module 77.

The enclosure 70 includes a front panel 71, a rear panel 72 parallel to the front panel 71, a top panel 73 connecting between the front panel 71 and the rear panel 72, and the side panel 74. The front panel 71, the rear panel 72, and the top panel 73 are perpendicular to the side panel 74. Disk drive modules 75 are disposed on the front panel 71 and near the top panel 73. A plurality of openings 711 is defined in the front panel 71. A plurality of airflow holes 733 is defined in the top panel 73 corresponding to the disk drive modules 75. The airflow holes 733 are disposed in the top panel 73 in a rectangle shape.

A motherboard (not labeled) is disposed on the side panel 74 of the computer enclosure 70. The motherboard is generally parallel to the side panel. The first fan module 10 is disposed on a CPU (not shown) of the motherboard.

The second fan module 761 is disposed on the rear panel 72. The rear panel 72 defines a first output vent 723 corresponding to the second fan module 761 of the computer power source 76, and a second output vent 725 corresponding to the third fan module 77.

Figure 2:
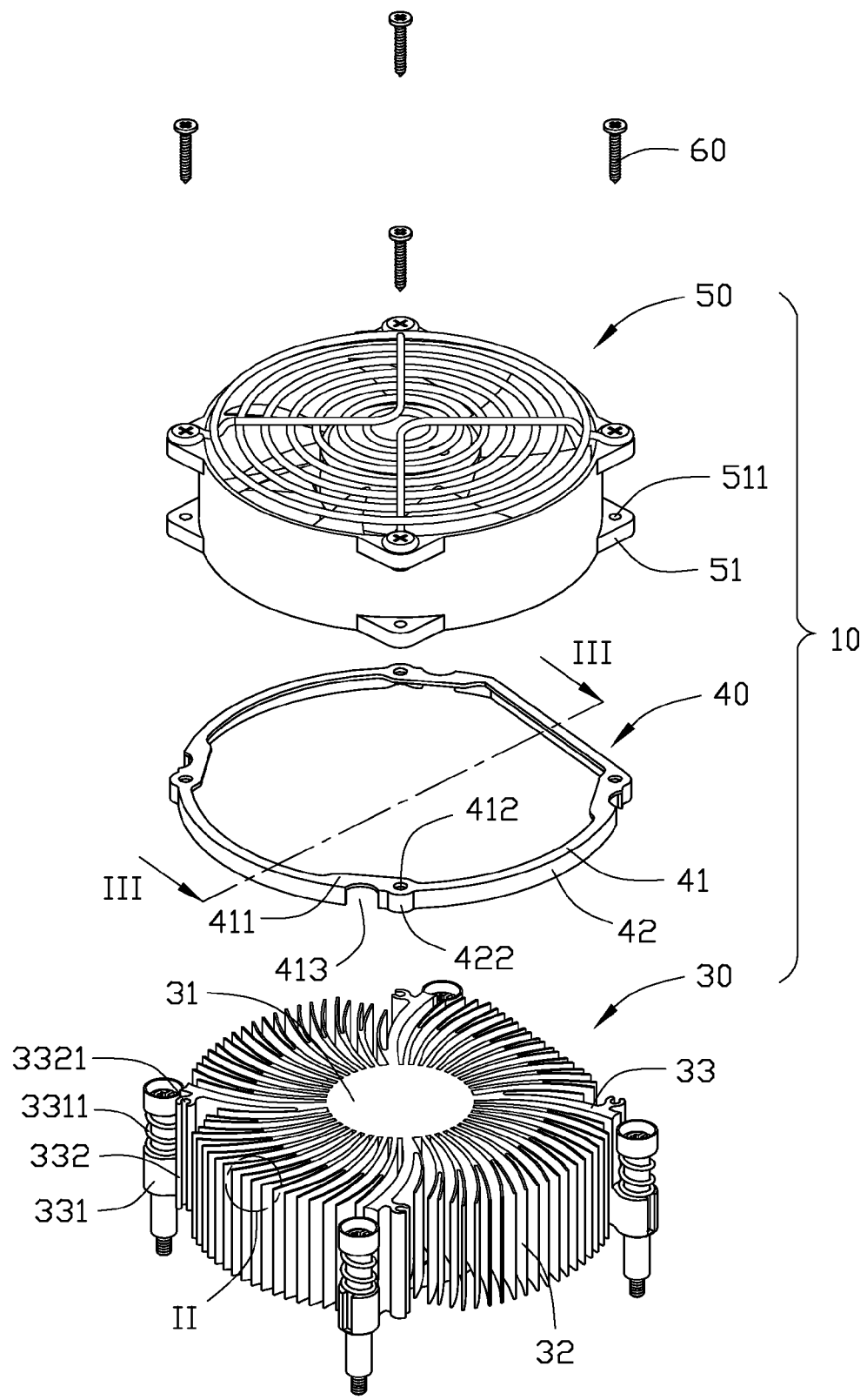
FIG. 2 is an exploded, isometric view of the first fan module of FIG. 1, the first fan module including a heat sink and a heat sink cover.
Figure 3:
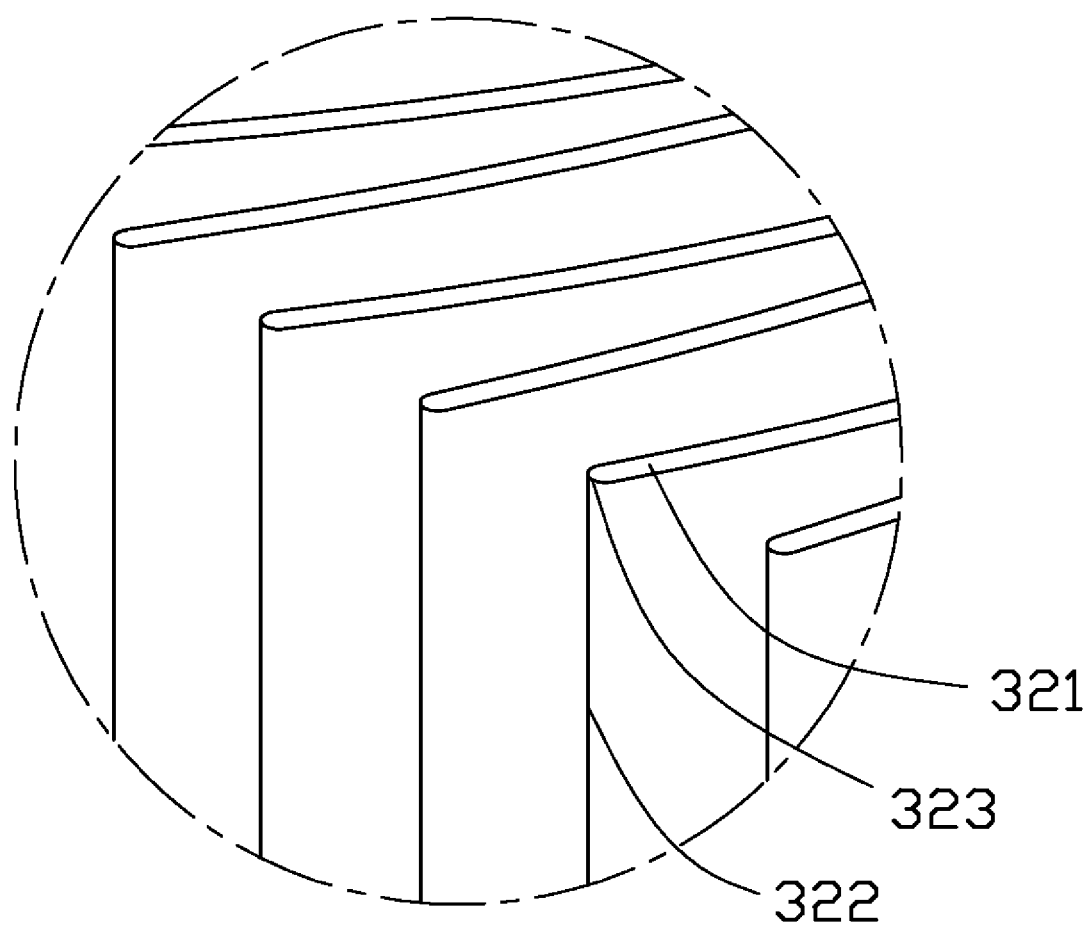
FIG. 3 is a partial enlarged, isometric view of the heat sink of FIG. 2, showing section II.

Referring to FIGS. 2 and 3, the first fan module 10 includes a heat sink 30, a heat sink cover 40, and a fan 50.

The heat sink 30 includes a base 31, a plurality of fins 32 extending radially from the base 31, and four securing portions 33 extending from the base 31. Each securing portion 33 includes a first mounting portion 331 and a second mounting portion 332. The first mounting portion 331 includes a fastener 3311 capable of securing the heat sink 30 to the motherboard. The second mounting portion 332 defines a securing hole 3321. Each fin 32 includes a first edge 321 and a second edge 322 perpendicular to the first edge 321. An angle portion 323 is corporately defined by the first edge 321 and the second edge 322.

The fan 50 includes four securing portions 51 extending therefrom. Each securing portion 51 defines a through hole 511 therein.

Figure 4:
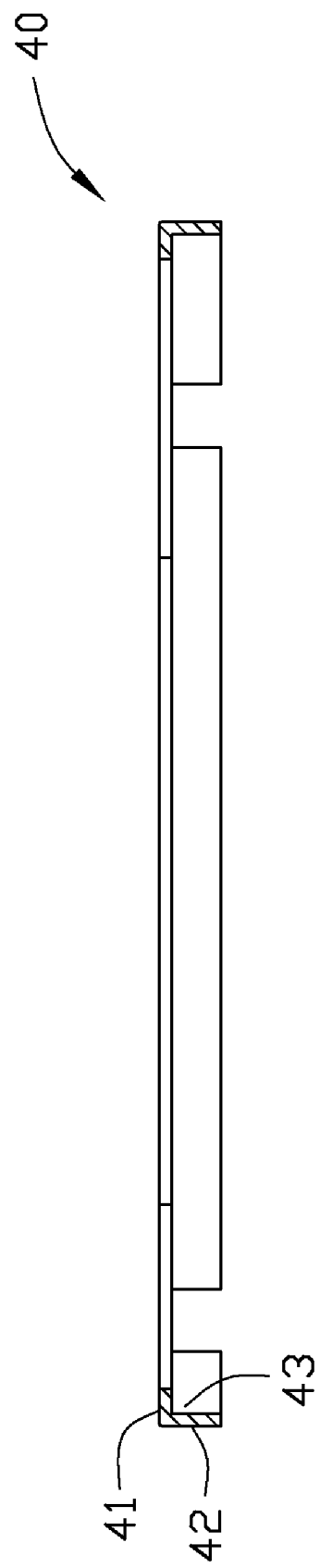
FIG. 4 is a section view of the heat sink cover of FIG. 2 taken along line III-III.

Referring to FIGS. 2 and 4, the heat sink cover 40 is used to cover the angle portions 323 of the heat sink 30. The heat sink cover 40 includes a first wall 41, and a second wall 42 perpendicularly extending from the first wall 41. A receiving space 43 is corporately defined by the first wall and the second wall 42. The cross section of the heat sink cover 40 is L-shaped. The first wall 41 includes four mounting portions 411. Each mounting portion 411 defines a through hole 412 corresponding to the securing hole 3321 of the heat sink 30 and an opening 413 corresponding to the fastener 3311. The second wall 42 has four receiving portions 422 for receiving the second mounting portions 332 respectively. The heat sink cover 40 is circular and surrounds the angle portions 323 of the heat sink 30.

Referring to FIGS. 2 to 4, in assembly of the first fan module 10, the heat sink cover 40 is disposed on the heat sink 30 to cover the angle portion of the heat sink 30. The receiving portions 422 of the heat sink cover 40 receive the second mounting portions 332 of the heat sink 30 respectively. The openings 413 of the heat sink cover 40 align with the first mounting portions 331 of the heat sink 30 respectively. The first cover portion 41 of the heat sink cover 40 contacts the first edge 321 of the heat sink 30 and the second cover portion 42 of the heat sink cover 40 contacts the second edges 322 of the heat sink 30. The receiving portion 43 receives the angle portions 323 of the fins 32. The through holes 511 of the fan 50 align with the through holes 412 of the heat sink cover 40 respectively. Four fasteners 60 are respectively extended through the through holes 511 of the fan 50, the through holes 412 of the heat sink cover 40, and then screwed into the securing holes 3321 of the heat sink 30 to secure the fan 50, the heat sink cover 40, and the heat sink 30 together.

Figure 5:
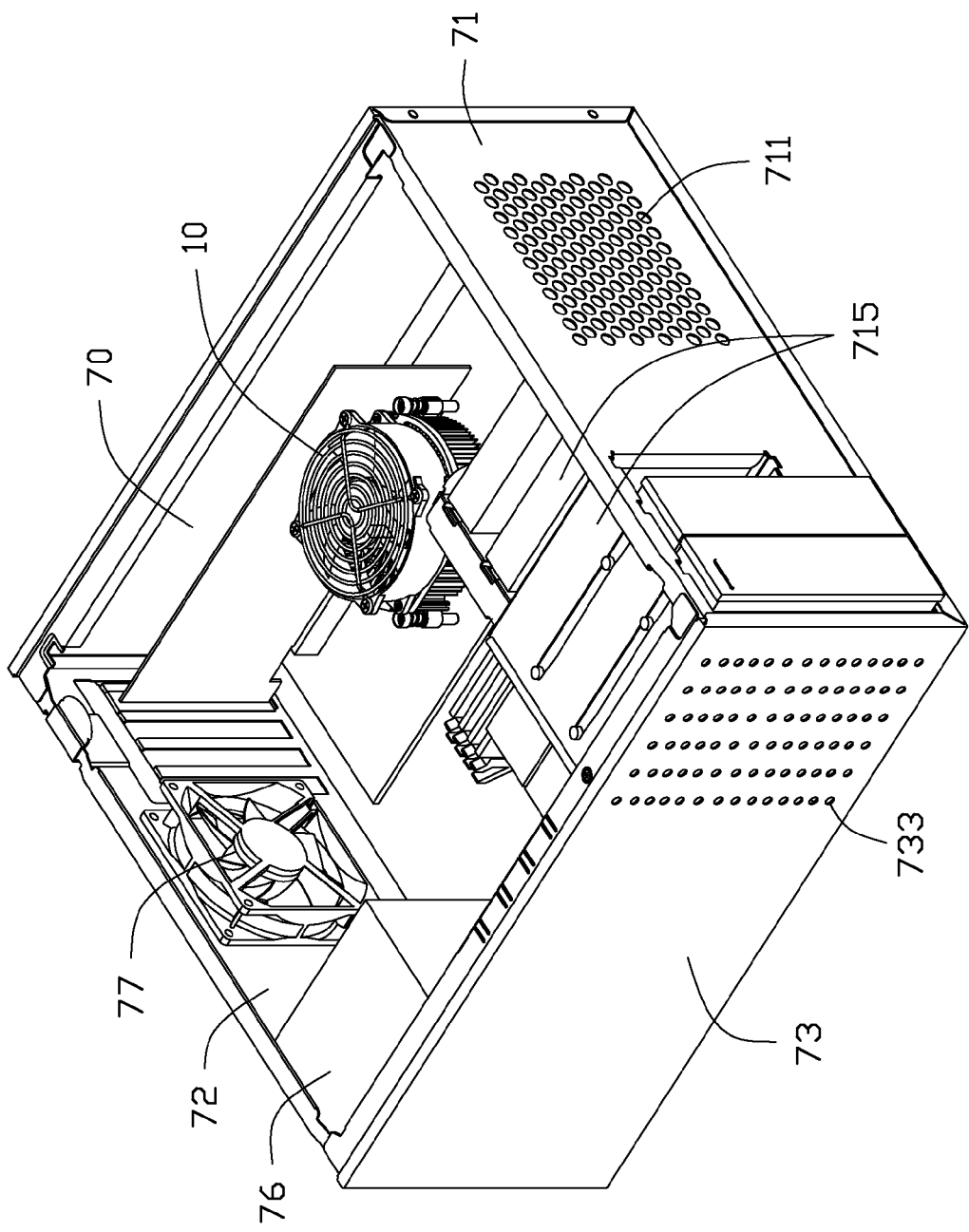
FIG. 5 is another isometric view of a heat dissipating system of an embodiment.

Referring to FIGS. 1 and 5, when the heat dissipating system is operating, the first fan module 10 collects air from outside. Part of the air flows into the enclosure 70 via the airflow holes 733 and the openings 711, thereby dissipating heat generated by the disk drive modules 75. Another part of the air flows into the enclosure 70 via the opening 711 to dissipate heat generated by other components of the motherboard. The third fan module 77 and the second fan module 761 of the computer power source 76 direct air out of the enclosure 70 via the first output vent 723 and the second output vent 725, respectively.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipating system, comprising:
an enclosure having a front panel, a rear panel parallel to the front panel, a side panel, and a top panel, the top panel connected between the front panel and the rear panel, the top panel, the front panel and the rear panel connected to the side panel, the rear panel defining a first output vent, a disk drive module disposed on the front panel and nearing the top panel, a motherboard with a CPU attached thereon;
a first fan module configured to dissipate heat generated by the CPU; and
a second fan module of a computer power source placed on the rear panel and aligned with the first output vent of the rear panel;
wherein the top panel defines a plurality of airflow holes corresponding to the disk drive module, the plurality of the airflow holes capable of allowing air to flow to the disk drive module for heat dissipation;
the first fan module comprises a heat sink placed on the CPU, a heat sink cover, and a fan secured on the heat sink; the heat sink is disposed between the CPU and the fan; the heat sink comprises a plurality of fins, a first mounting portion, and a second mounting portion; each of the plurality of fins having an angle portion; the heat sink cover is placed on the heat sink and covers the angle portions; the heat sink cover defines a first through hole; the first mounting portion comprises a first fastener secured to the motherboard in a first direction; the second mounting portion defines a securing hole corresponding to the first through hole; a second fastener is secured into the first through hole and the securing hole in a second direction substantially parallel to the first direction to secure the heat sink cover to the heat sink.

2. The heat dissipating system of claim 1, wherein the front panel defines a plurality of openings for allowing air to flow into the enclosure, part of the plurality of openings are aligned with the disk drive module.

3. The heat dissipating system of claim 1 further comprising a third fan module placed on the rear panel, the rear panel defining a second output vent corresponding to the third fan module.

4. The heat dissipating system of claim 1, wherein the plurality of the airflow holes disposed in the top panel is arranged in a rectangle shape.

5. The heat dissipating system of claim 1, wherein the motherboard is generally parallel to the side panel.

6. The heat dissipating system of claim 1, wherein the heat sink cover comprises a first wall and a second wall extending from the first wall, a receiving space is cooperatively defined by the first wall and the second wall, the receiving space receives the angle portions of the heat sink.

7. The heat dissipating system of claim 6, wherein each of the plurality of fins comprises a first edge and a second edge connecting the first edge, the angle portion is cooperatively defined by the first edge and the second edge.

8. The heat dissipating system of claim 7, wherein the first wall contacts the first edge and the second wall contacts the second edge.

9. The heat dissipating system of claim 1, wherein the cross section of the heat sink cover is L-shaped.

10. The heat dissipating system of claim 1, wherein the fan defines a second through hole aligned with the first through hole, the second fastener is secured into the first through hole, the second through hole, and the securing hole to secure the fan, the heat sink cover, and the heat sink together.

11. A heat dissipating system, comprising:
an enclosure having a front panel, a rear panel parallel to the front panel, a side panel, and a top panel connected between the front panel and the rear panel, the top panel, the front panel and the rear panel being connected to the side panel, the rear panel defining an output vent, a disk drive module is disposed on the front panel near to the top panel, a motherboard with a CPU attached on the side panel;
a first fan module comprising a heat sink placed on the CPU, a heat sink cover, and a fan secured on the heat sink; and
a second fan module of a computer power source placed on the rear panel and aligned with the output vent of the rear panel;
wherein the heat sink is disposed between the CPU and the fan; the heat sink comprises a plurality of fins, a first mounting portion, and a second mounting portion; each of the plurality of fins having an angle portion; the heat sink cover is placed on the heat sink and covers the angle portions; the heat sink cover defines a first through hole, the first mounting portion comprises a first fastener secured to the motherboard in a first direction; the second mounting portion defines a securing hole corresponding to the first through hole; a second fastener is secured into the first through hole and the securing hole in a second direction substantially parallel to the first direction to secure the heat sink cover to the heat sink.

12. The heat dissipating system of claim 11, wherein the fan defines a second through hole aligned with the first through hole; the second fastener is secured into the first through hole, the second through hole, and the securing hole to secure the fan, the heat sink cover, and the heat sink together.

13. The heat dissipating system of claim 11, wherein the top panel defines a plurality of airflow holes aligned with the disk drive module, the plurality of the airflow holes allowing air to flow to the disk drive module for heat dissipation.

14. The heat dissipating system of claim 11, wherein the front panel defines a plurality of openings allowing air to flow into the enclosure, and a part of the plurality of openings are aligned with the disk drive module.

* * * * *